(12) United States Patent
Guo et al.

(10) Patent No.: US 11,205,897 B2
(45) Date of Patent: Dec. 21, 2021

(54) DC POWER SUPPLY SYSTEM

(71) Applicant: Delta Electronics (Shanghai) CO., LTD, Shanghai (CN)

(72) Inventors: Xingkuan Guo, Shanghai (CN); Xinmin Bai, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 17/080,825

(22) Filed: Oct. 26, 2020

(65) Prior Publication Data

US 2021/0135456 A1 May 6, 2021

(30) Foreign Application Priority Data

Oct. 30, 2019 (CN) .......................... 201911046655.1

(51) Int. Cl.
*H02J 3/00* (2006.01)
*H02J 3/38* (2006.01)
*H02M 3/28* (2006.01)
*H03M 1/00* (2006.01)

(52) U.S. Cl.
CPC ............... *H02J 3/381* (2013.01); *H02M 3/28* (2013.01); *H03M 1/001* (2013.01)

(58) Field of Classification Search
CPC .... H02M 3/28; H02M 3/1582; H02M 1/0067; H02J 2310/16; H02J 3/381; H02J 9/061; H02J 1/102; H03M 1/001
See application file for complete search history.

(56) References Cited

U.S. PATENT DOCUMENTS

| | | | |
|---|---|---|---|
| 7,307,361 B1* | 12/2007 | Bendre | H02M 5/225 307/83 |
| 2017/0005571 A1 | 1/2017 | Wang et al. | |
| 2018/0175619 A1 | 6/2018 | Mayo | |
| 2019/0260226 A1 | 8/2019 | Lu et al. | |
| 2019/0334276 A1* | 10/2019 | Ichikawa | H05K 5/0026 |

(Continued)

FOREIGN PATENT DOCUMENTS

| CN | 202309201 U | 7/2012 |
|---|---|---|
| CN | 102246403 B | 6/2013 |

(Continued)

OTHER PUBLICATIONS

Kevin McCarthy: "Comparing UPS System Design Configurations", Nov. 1, 2004, pp. 1-27, XP055467111.

(Continued)

*Primary Examiner* — Jared Fureman
*Assistant Examiner* — Esayas G Yeshaw
(74) *Attorney, Agent, or Firm* — Qinghong Xu

(57) ABSTRACT

The present disclosure provides a DC power supply system, comprising: a first power supply circuit and a second power supply circuit, each power supply circuit comprises a phase-shifting transformer and an AC-DC conversion circuit; and a bidirectional electronic switch electrically coupled between the output end of the first power supply circuit and the output end of the second power supply circuit, wherein the bidirectional electronic switch is configured to transmit power between the output end of the first power supply circuit and the output end of the second power supply circuit depend on the voltage difference of the two output voltages.

15 Claims, 8 Drawing Sheets

(56) References Cited

U.S. PATENT DOCUMENTS

| | | |
|---|---|---|
| 2020/0006970 A1* | 1/2020 | Chen ........................ H02J 9/061 |
| 2020/0059111 A1 | 2/2020 | Guo et al. |
| 2020/0122265 A1* | 4/2020 | Kawai .................... B23K 9/073 |
| 2020/0127581 A1* | 4/2020 | Chen ................. H02M 3/33584 |
| 2020/0195125 A1* | 6/2020 | Slepchenkov .......... H02M 1/12 |
| 2021/0066912 A1* | 3/2021 | Mitsunaga ........ H02J 7/007194 |

FOREIGN PATENT DOCUMENTS

| | | |
|---|---|---|
| CN | 205429761 U | 8/2016 |
| CN | 205429765 U | 8/2016 |
| CN | 108923409 A | 11/2018 |
| CN | 110247562 A | 9/2019 |
| EP | 2665152 A2 | 11/2013 |

OTHER PUBLICATIONS

Extended European Search Report dated Mar. 29, 2021 from EP patent application No. 20204640.5.

\* cited by examiner

DC POWER SUPPLY SYSTEM

CROSS REFERENCE TO RELATED APPLICATIONS

The present application claims the priority of Chinese Patent Application No. 201911046655.1, titled "DC POWER SUPPLY SYSTEM", filed on Oct. 30, 2019. The entire content of this Chinese patent application is incorporated herein by reference.

TECHNICAL FIELD

The present disclosure relates to the technical field of power electronics, and in particular, to a DC power supply system.

BACKGROUND

The DC power supply is highly efficient and reliable, and thus has been widely used in the field of power supply in data center. In a traditional DC power supply scheme, at least two conventional power transformers that convert an AC medium-voltage of 10 kV to an AC low-voltage of 380V are adopted, where the 10 kV have backup source that either from different power grids or from different generators. Each AC low-voltage bus on a secondary side of the transformer can be connected in parallel through switches, so that when one of the transformers is in maintenance or one of the 10 kV AC sources fails, it is possible to ensure the redundancy of the power supply for the IT equipment downstream. However, the efficiency in the traditional DC power supply scheme is limited.

It should be noted that the information disclosed in the Background section above is only for a better understanding of the disclosure, and thus may include information that does not constitute the prior art known to those skilled in the art.

SUMMARY

According to an aspect of the present disclosure, a DC power supply system is provided, including: a first power supply circuit and a second power supply circuit, each power supply circuit includes a phase-shifting transformer and an AC-DC conversion circuit, wherein an output end of the first power supply circuit is electrically coupled to an input end of a first power conversion device of a load, and an output end of the second power supply circuit is electrically coupled to an input end of a second power conversion device of the load; and a bidirectional electronic switch electrically coupled between the output end of the first power supply circuit and the output end of the second power supply circuit, the bidirectional electronic switch being configured to: transmit the output power of the first power supply circuit to the input end of the second power conversion device, when the difference obtained by subtracting an output voltage of the second power supply circuit from the output voltage of the first power supply circuit is greater than or equal to a first threshold; and transmit the output power of the second power supply circuit to the input end of the first power conversion device, when the difference obtained by subtracting the output voltage of the first power supply circuit from the output voltage of the second power supply circuit is greater than or equal to a second threshold.

According to another aspect of the present disclosure, another DC power supply system is provided, including: a number 2N+1 of power supply circuits, each of the power supply circuits including a phase-shifting transformer and an AC-DC conversion circuit; a number 2N of power conversion devices, every two power conversion devices are electrically coupled to a same load, and a number 2N of electronic switches; wherein, the output ends of the first to the 2Nth power supply circuits are electrically coupled to the input ends of the 2N power conversion devices in the one-to-one correspondence; the first to the 2Nth electronic switches are electrically coupled between the output end of the corresponding one of the first to the 2Nth power supply circuits and the output end of the (2N+1)th power supply circuit; each of the electronic switches is configured to transmit the output power of the (2N+1)th power supply circuit to the input end of the corresponding one of the power conversion devices, when the difference obtained by subtracting the output voltage of the corresponding one of the first to the 2Nth power supply circuits from the output voltage of the (2N+1)th power supply circuit is greater than or equal to a threshold; wherein N is a integer greater than or equal to 1.

It should be understood that the above general description and the following detailed description are merely exemplary and explanatory and are not restrictive.

BRIEF DESCRIPTION OF THE DRAWINGS

The accompanying drawings, which are incorporated into the specification and form apart of the specification, show the embodiments in accordance with the present disclosure and are used together with the specification to explain the principle of the disclosure. Obviously, the drawings in the following description are only some embodiments of the present disclosure, and those skilled in the art can obtain other drawings according to the drawings without any creative effort.

DETAILED DESCRIPTION

Figure 1:
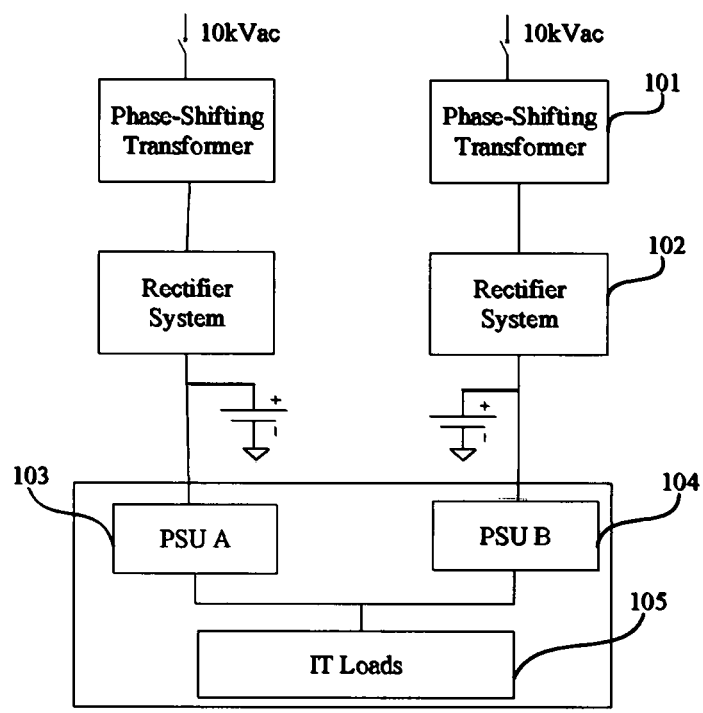
FIG. 1 is a schematic diagram showing a DC power supply system using a phase-shifting transformer according to a comparison embodiment.

Example embodiments will now be described more fully with reference to the accompanying drawings. However, the exemplary embodiments can be embodied in a variety of forms and should not be construed as being limited to the embodiments set forth herein. Instead, these embodiments are provided so that the disclosure will be comprehensive and complete, and the idea of an exemplary embodiment fully communicated to those skilled in the art. The same reference numerals in the drawings denote the same or similar structures, and thus their detailed description will be omitted.

Although the relative terms such as "above" and "below" are used in the specification to describe the relative relationship of one component to another component to the icon, these terms are used in this specification for convenience only, for example, according to the direction of the example in the accompanying drawings. It will be understood that if the device of the icon is flipped upside down, the component described "above" will become the component "below". When a structure is "above" another structure, it may mean that a structure is integrally formed on another structure, or that a structure is "directly" disposed on another structure, or that a structure is "indirectly" disposed on other structures through another structure.

The terms "a", "an" "the" "said" and "at least one" are used to mean the existence of one or more elements/ components/etc.; the terms "comprising" and "having" are used to mean an inclusive meaning and mean that there are additional elements/components/etc. in addition to the listed elements/components/etc.; the terms "first", "second", and "third" etc. are used merely as a token, but not a limitation on the number of objects.

There is provided a DC power supply system in the exemplary embodiment to implement redundant power supply of the load.

FIG. 1 is a schematic diagram showing a DC power supply system using a phase-shifting transformer that known to the inventor. As shown in FIG. 1, there are at least two power supply circuit connected to a load 105, in each power supply circuit, a phase-shifting transformer 101 is used to transform AC medium-voltage of 10 kV to AC low-voltage of 380V or 270V, and then a corresponding DC voltage is obtained by the rectifier system 102, which is used to supply power to a power conversion device 103 and a power conversion device 104 of the load 105 downstream, where the load 105 can be an IT device. The power supply scheme using a phase-shifting transformer is nearly 2% more efficient than the traditional DC power supply scheme using conventional power transformer.

However, the low-voltage AC side of each phase-shifting transformer has a plurality of windings, and thus the parallel connection of the low-voltage AC bus-bar is no longer applicable. In this way, when one of the phase-shifting transformers is in maintenance or one of the 10 kV sources fails, the power supply of the IT equipment downstream will lose redundancy, and some IT equipment will face the risk of shutdown.

Figure 2:
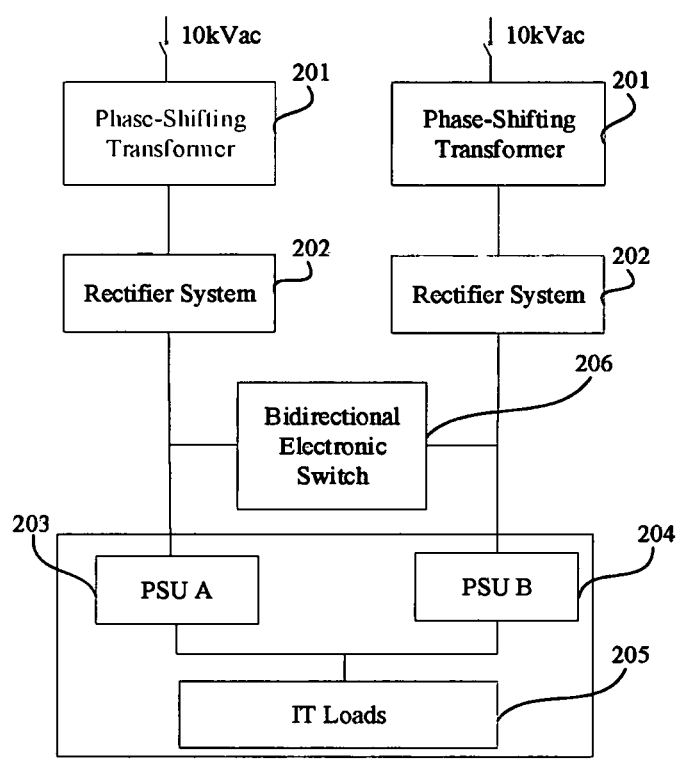
FIG. 2 is a schematic diagram showing a DC power supply system in an embodiment of the present disclosure.

As shown in FIG. 2, the DC power supply system provided by the embodiment of the present disclosure includes a first power supply circuit, a second power supply circuit, and a bidirectional electronic switch, wherein, each of the first power supply circuit and the second power supply circuit includes a phase-shifting transformer 201 and an AC-DC conversion circuit, that is the rectifier system 202, and the output end of the first power supply circuit is electrically coupled to the input end of a first power conversion device 203 (PSU A) of a load 205, and the output end of the second power supply circuit is electrically coupled to the input end of a second power conversion device 204 (PSU B) of the same load 205. The bidirectional electronic switch 206 is electrically coupled between the output end of the first power supply circuit and the output end of the second power supply circuit. The bidirectional electronic switch 206 is configured to transmit the output power of the first power supply circuit to the input end of the second power conversion device 204, when the difference obtained by subtracting the output voltage of the second power supply circuit from the output voltage of the first power supply circuit is greater than or equal to a first threshold, and the bidirectional electronic switch 206 is also configured to transmit the output power of the second power supply circuit to the input end of the first power conversion device 203, when the difference obtained by subtracting the output voltage of the first power supply circuit from the output voltage of the second power supply circuit is greater than or equal to a second threshold.

In the embodiment of the present disclosure, an energy path is provided between the output end of the first power supply circuit and the output end of the second power supply circuit by the bidirectional electronic switch 206, when the difference between the output voltage of the first power supply circuit and the second power supply circuit satisfies the set conditions, so that the two power conversion devices of the load can still have normal power supply when the first power supply circuit or the second power supply circuit is abnormal, and a redundant design for power supply to the load is realized.

The first threshold and the second threshold are respectively preset values, and different settings may be made according to different application environments.

As shown in FIG. 2, PSU A and PSU B, that is, the first power conversion device 203 and the second power conversion device 204, are two power supplies of the IT loads 205. IT loads (Information Technology Loads) typically have two power conversion devices as redundant power supply.

In the embodiment of the present disclosure, the output voltage of the first power supply circuit and the output voltage of the second power supply circuit may be equal or not equal.

Figure 3:
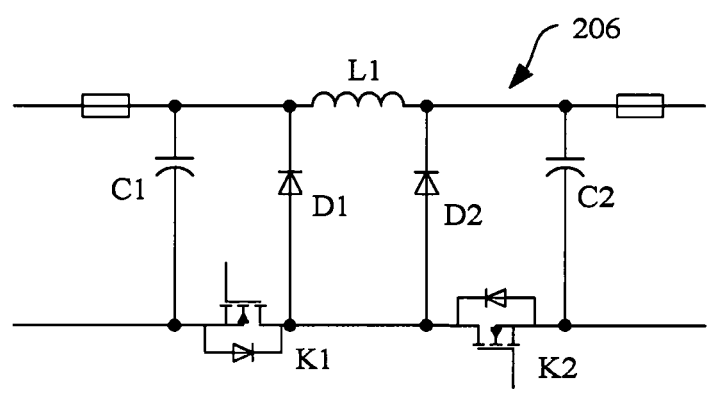
FIG. 3 is a schematic diagram showing a bidirectional electronic switch in an embodiment of the present disclosure.
Figure 4:
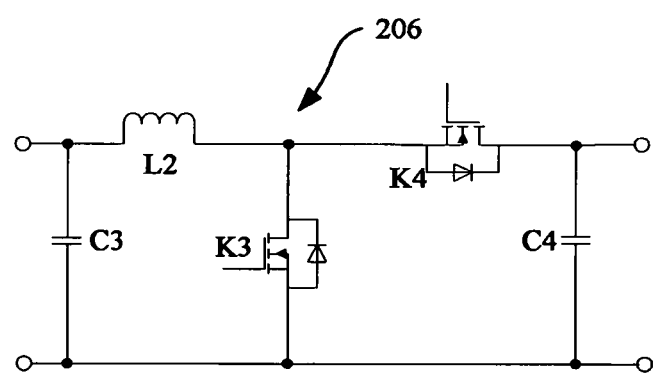
FIG. 4 is a schematic diagram showing a bidirectional electronic switch in another embodiment of the present disclosure.

In one or more embodiment of the present disclosure, the bidirectional electronic switch can be a bidirectional DC-DC converter as shown in FIG. 3 and FIG. 4.

As shown in FIG. 3, the bidirectional DC-DC converter includes a first end electrically coupled to the output end of the first power supply circuit and a second end electrically coupled to the output end of the second power supply circuit. The bidirectional DC-DC converter includes two switching devices K1 and K2, an inductor L1, two diodes D1 and D2, and two optional capacitors C1 and C2. Where the first end of the first switching device K1 is electrically coupled to the cathode of the first end of the bidirectional DC-DC converter, the first end of the second switching device K2 is electrically coupled to the cathode of the second end of the bidirectional DC-DC converter, and the second end of the first switching device K1 is electrically coupled to the second end of the second switching device K2. The inductor L1 is electrically coupled between the anode of the first end and the anode of the second end of the bidirectional DC-DC converter. The first capacitor C1 is electrically coupled in parallel with the first end of the bidirectional DC-DC converter, and the second capacitor C2 is electrically coupled in parallel with the second end of the bidirectional DC-DC converter. The anode of the first diode D1 is electrically coupled to the second end of the first switching device K1, and the cathode of the first diode D1 is electrically coupled to the anode of the first end of the bidirectional DC-DC converter. The anode of the second diode D2 is electrically coupled to the second end of the second switching device K2, and the cathode of the second diode D2 is electrically coupled to the anode of the second end of the bidirectional DC-DC converter.

The work process of the bidirectional DC-DC converter shown in FIG. 3 can be described in brief as below; when the second switching device K2 is kept on, the first switching device K1 works on and off periodically, as a result, the first switching device K1, the first diode D1 and the inductor L1 form a typical buck converter that can transfer the power from the first side to the second side. While the first switching device K1 is kept on, the second switching device K2 works on and off periodically, then as a result, the second switching device K2, the second diode D2 and the inductor L1 forms a typical buck converter that can transfer the power from the second side to the first side. What worth note is the duty can be set to 100% in some embodiments.

In some embodiments of the present disclosure, the first switching device K1 and the second switching device K2 may include one or more field effect transistors or insulated gate bipolar transistors, that is, the first and second switching device can be a series or parallel combination of multiple field effect transistors or insulated gate bipolar transistors.

In some embodiments of the present disclosure, as shown in FIG. 4, the bidirectional DC-DC converter includes: two switching devices K3 and K4, an inductor L2, and two capacitors C3 and C4. Where the first end of the third switching device K3 is electrically coupled to the cathode of the first end and the second end of the bidirectional DC-DC converter, the first end of the fourth switching device K4 is electrically coupled to the second end of the third switching device K3, and the second end of the fourth switching device K4 is electrically coupled to the anode of the second end of the bidirectional DC-DC converter. The inductor L2 is electrically coupled between the anode of the first end of the bidirectional DC-DC converter and the second end of the third switching device K3. The third capacitor C3 is electrically coupled in parallel with the first end of the bidirectional DC-DC converter, and the fourth capacitor C4 is electrically coupled in parallel with the second end of the bidirectional DC-DC converter;

In the embodiment shown in FIG. 4, the third switching device K3 and the forth switching device K4 are complementary on and off periodically, then the inductor L3, the third switching device K3, the forth switching device K4 function either as a boost converter viewed from the first side or as a buck converter viewed from the second side. So the power can be transferred either from the first side to the second side or from the second side to the first side which determined by the duty control of the two switching devices K3 and K4. What worth note is the duty can be set to 100% in some embodiments.

In some embodiments of the present disclosure, the third switching device K3 and the fourth switching device K4 may include at least one field effect transistor or insulated gate bipolar transistor.

Additionally, the bidirectional electronic switch 206 can also include a semiconductor switch. The semiconductor switch can be any of the following: an insulated gate bipolar transistor, a field effect transistor, a thyristor, or a static transfer switch. In some embodiments of the present disclosure, the bidirectional electronic switch 206 can be a series or parallel combination of the semiconductor switches.

Figure 5:
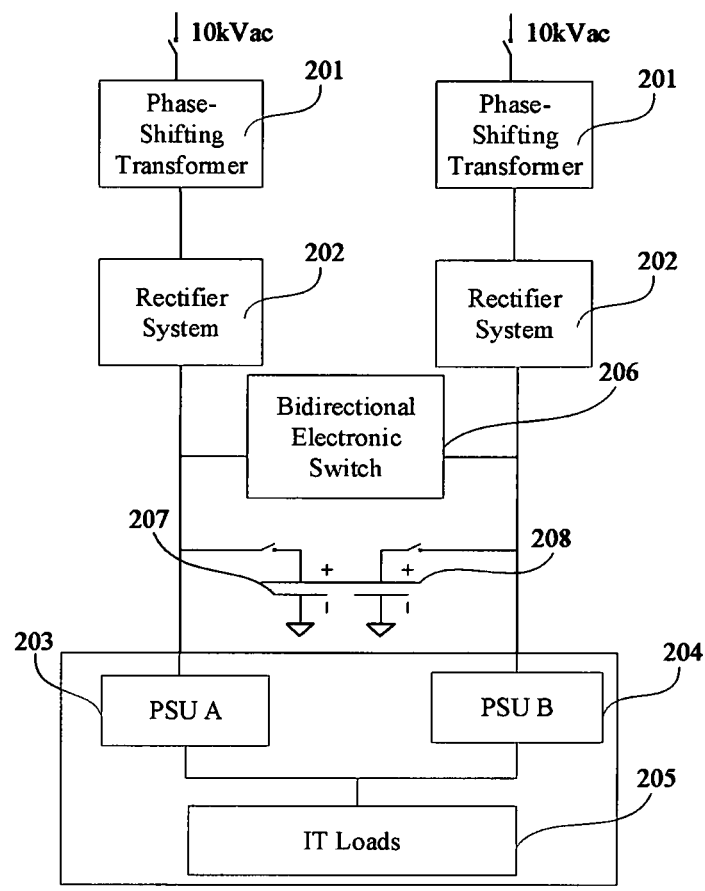
FIG. 5 is a schematic diagram showing a DC power supply system in another embodiment of the present disclosure.

As shown in FIG. 5, the DC power supply system may further include a first energy storage device 207 and a second energy storage device 208, wherein the first energy storage device 207 is electrically coupled to the output end of the first power supply circuit and the input end of the first power conversion device 203 of the load, and the second energy storage device 208 is electrically coupled to the output end of the second power supply circuit and the input end of the second power conversion device 204 of the load.

In the embodiment of the present disclosure, the DC power supply system further includes: a first voltage detecting device (not shown) electrically coupled to the output end of the first power supply circuit for detecting the output voltage of the first power supply circuit, and generating a first detection value; a second voltage detecting device (not shown) electrically coupled to the output end of the second power supply circuit for detecting the output voltage of the second power supply circuit, and generating a second detection value; a controller (not shown) receiving the first detection value and the second detection value, and generating a control signal according to the first detection value and the second detection value, where the control signal is used for controlling the bidirectional electronic switch 206.

Figure 6:
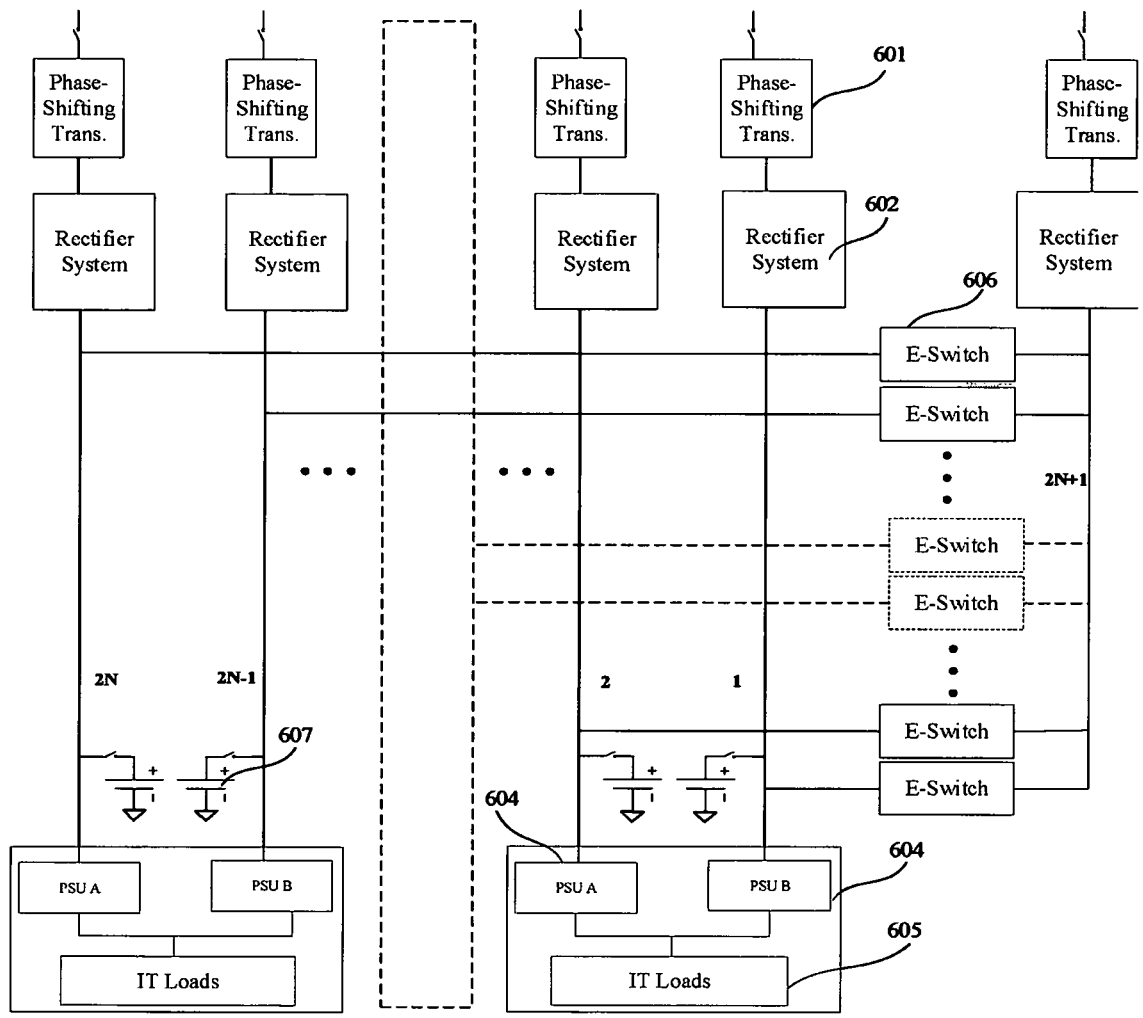
FIG. 6 is a schematic diagram showing a DC power supply system in still another embodiment of the present disclosure.

As shown in FIG. 6, another DC power supply system provided by the embodiment of the present disclosure includes: a number 2N+1 of power supply circuits, a number 2N of power conversion devices 604, and a number 2N of electronic switches 606. Wherein, each of the power supply circuits includes a phase-shifting transformer 601 and a rectifier system 602, and each of the loads 605 corresponds to two power conversion devices 604. The output ends of the first to the 2Nth power supply circuits are electrically coupled to the input ends of the 2N power conversion devices 604 in the one-to-one correspondence; the first to the 2Nth electronic switches 606 are electrically coupled between the output end of the corresponding one of the first to the 2Nth power supply circuits and the output end of the (2N+1)th power supply circuit; each of the electronic switches 606 is configured to convert and transmit the output power of the (2N+1)th power supply circuit to the input end of the corresponding one of the power conversion device 604, when the difference obtained by subtracting the output voltage of the corresponding one of the first to the 2Nth power supply circuits from the output voltage of the (2N+1)th power supply circuit is greater than or equal to a third threshold; wherein N is a integer greater than or equal to 1. The third threshold is a preset value, and can be set differently according to the specific application environment.

In some embodiments of the disclosure, the output voltage of one of the power supply circuits is different from the output voltage of another one of the power supply circuit.

The electronic switch 606 can be a unidirectional DC-DC converter or a bidirectional DC-DC converter or a semiconductor switch. Wherein, the semiconductor switch may be, but not limited to, any one of the following devices: an insulated gate bipolar transistor, a field effect transistor, a thyristor or a static transfer switch.

As shown in FIG. 6, the DC power supply system may further include 2N energy storage devices 607, and the output ends of the first to the 2Nth power supply circuits are electrically coupled to a corresponding one of energy storage devices 607, respectively.

Figure 7:
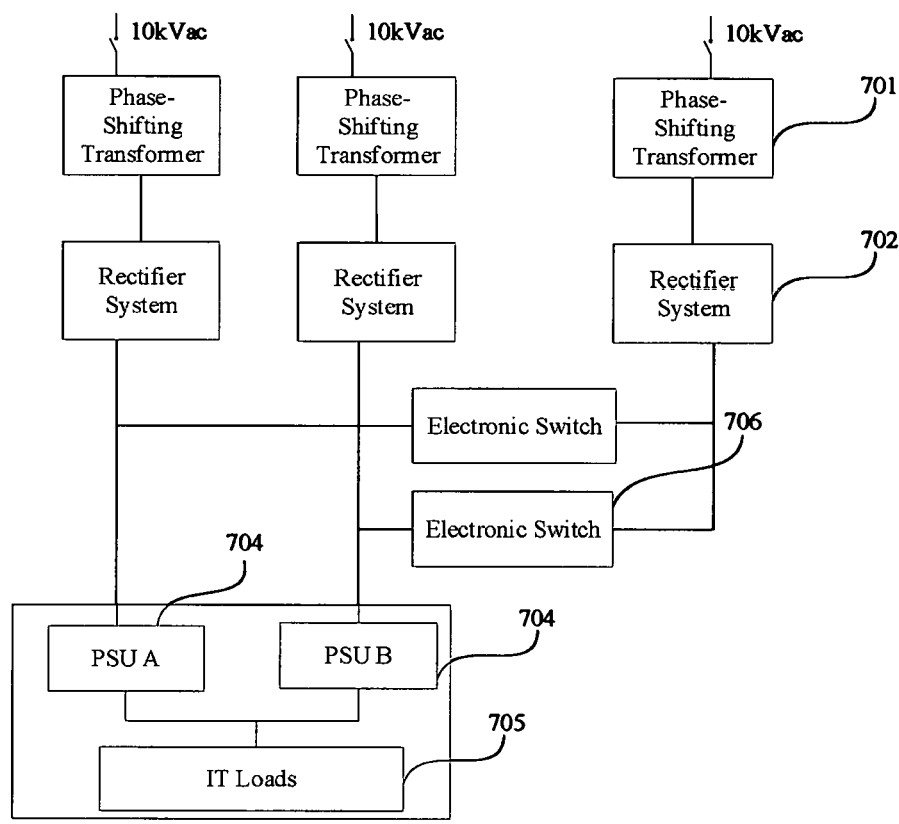
FIG. 7 is a schematic diagram showing a DC power supply system in still another embodiment of the present disclosure.

In the DC power supply system shown in FIG. 7, N=1, there are three power supply circuits, and each of the power supply circuits includes a phase-shifting transformer 701 and a rectifier system 702. Wherein, the output ends of the first and second power supply circuits are respectively coupled to the input ends of two power conversion devices 704 of a load 705, and the output end of the third power supply circuit is correspondingly coupled to the output ends of the first and the second power supply circuits through two electronic switches 706. In this way, when the power supply of the first or second power supply circuit is abnormal, the third power supply circuit can supply power to the two power conversion devices 704 of the load 705 through the corresponding electronic switch 706, and a redundant design for power supply to the load is realized.

Figure 8:
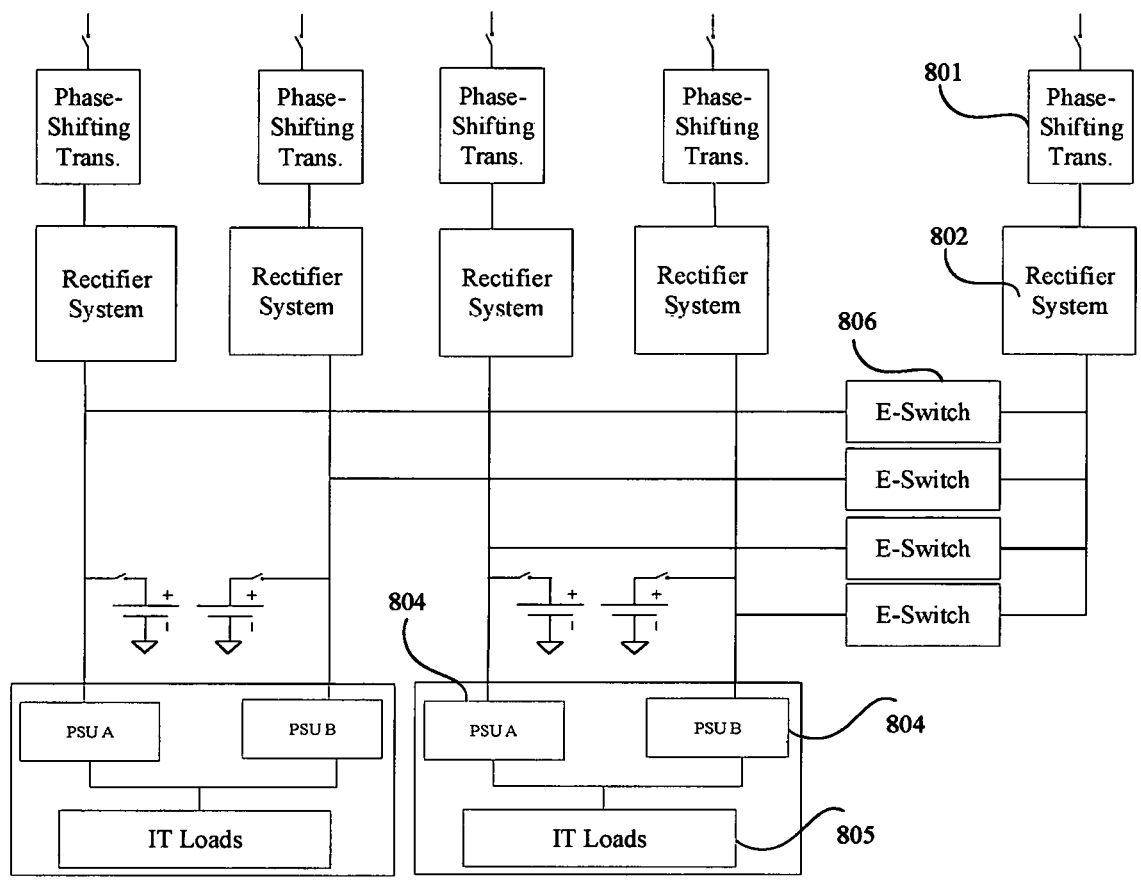
FIG. 8 is a schematic diagram showing a DC power supply system in still another embodiment of the present disclosure.

In the DC power supply system shown in FIG. 8, N=2, there are five power supply circuits, and each of the power supply circuits includes a phase-shifting transformer 801 and a rectifier system 802. Wherein, the output ends of the first to the fourth power supply circuits are respectively coupled to the input ends of four power conversion devices 804, and the output end of the fifth power supply circuit is correspondingly coupled to the outputs of the first to the fourth power supply circuits through four electronic switches 806. In this way, when any of the first to the fourth power supply circuits is powered abnormally, the fifth power supply circuit can provide electrical energy to the four power conversion devices 804 through the corresponding electronic switch 806, and a redundant design for power supply to the load is realized.

The DC power supply system in the embodiment of the present disclosure, an electronic switch can be coupled between the output end of the first power supply circuit and the output end of the second power supply circuit. When the first power supply circuit or the second power supply circuit is abnormal, the power output from the power supply circuit that is still working normally can be transmitted to the output end of the power supply circuit in abnormal by the electronic switch, so that the load always has normal power supply, and a redundant design for power supply to the load is realized.

Other embodiments of the disclosure will be apparent to those skilled in the arts. The present application is intended to cover any variations, uses, or adaptations of the present disclosure, which are in accordance with the general principles of the present disclosure and include common general knowledge or conventional technical solutions in the art that are not disclosed in the present disclosure. The specification and embodiments are regarded as being illustrative only, and the true scope and spirit of the disclosure is pointed out by the appended claims.

What is claimed is:

1. A DC power supply system, comprising:
a first power supply circuit and a second power supply circuit, each of the power supply circuit comprises a phase-shifting transformer and an AC-DC conversion circuit, wherein an output end of the first power supply circuit is electrically coupled to an input end of a first power conversion device of a load, and an output end of the second power supply circuit is electrically coupled to an input end of a second power conversion device of the load; and
a bidirectional electronic switch electrically coupled between the output end of the first power supply circuit and the output end of the second power supply circuit, the bidirectional electronic switch being configured to;
transmit the output power of the first power supply circuit to the input end of the second power conversion device, when the difference obtained by subtracting the output voltage of the second power supply circuit from the output voltage of the first power supply circuit is greater than or equal to a first threshold;
transmit the output power of the second power supply circuit to the input end of the first power conversion device, when the difference obtained by subtracting the output voltage of the first power supply circuit from the output voltage of the second power supply circuit is greater than or equal to a second threshold.

2. The DC power supply system according to claim 1, wherein, the bidirectional electronic switch comprises a bidirectional DC-DC converter.

3. The DC power supply system according to claim 2, wherein, the bidirectional DC-DC converter comprises at least one switching device and at least one inductor, the bidirectional DC-DC converter is configured as a boost converter, a buck converter or a buck-boost converter.

4. The DC power supply system according to claim 3, wherein, the switching device comprises at least one field effect transistor or insulated gate bipolar transistor.

5. The DC power supply system according to claim 1, wherein, the bidirectional electronic switch comprises a semiconductor switch.

6. The DC power supply system according to claim 5, wherein, the semiconductor switch comprises any of the following devices: an insulated gate bipolar transistor, a field effect transistor, a thyristor, or a static transfer switch.

7. The DC power supply system according to claim 1, further comprising:
a first energy storage device and a second energy storage device, the first energy storage device being electrically coupled to the output end of the first power supply circuit, and the second energy storage device being electrically coupled to the output end of the second power supply circuit.

8. The DC power supply system according to claim 1, wherein, the output voltage of the first power supply circuit is not equal to the output voltage of the second power supply circuit.

9. The DC power supply system according to claim 1, further comprising:
a first voltage detecting device, being electrically coupled to the output end of the first power supply circuit for detecting the output voltage of the first power supply circuit, and generating a first detection value;
a second voltage detecting device, being electrically coupled to the output end of the second power supply circuit for detecting the output voltage of the second power supply circuit, and generating a second detection value;
a controller, receiving the first detection value and the second detection value, and generating a control signal according to the first detection value and the second detection value for controlling the bidirectional electronic switch.

10. A DC power supply system, comprising:
a number 2N+1 of power supply circuits, each of the power supply circuits comprising a phase-shifting transformer and an AC-DC conversion circuit;
a number 2N of power conversion devices, every two power conversion devices are electrically coupled to a same load; and
a number 2N of electronic switches;
wherein, the output ends of the first to the 2Nth power supply circuits are electrically coupled to the input ends of the 2N power conversion devices in the one-to-one correspondence; and the first to the 2Nth electronic switches are electrically coupled between the output end of the corresponding one of the first to the 2Nth power supply circuits and the output end of the (2N+1)th power supply circuit;
each of the electronic switches is configured to transmit the output power of the (2N+1)th power supply circuit to the input end of the corresponding one of the power conversion devices, when the difference obtained by subtracting the output voltage of the corresponding one of the first to the 2Nth power supply circuits from the output voltage of the (2N+1)th power supply circuit is greater than or equal to a threshold;

wherein, N is an integer greater than or equal to 1.

11. The DC power supply system according to claim 10, wherein, the electronic switch comprises a DC-DC converter.

12. The DC power supply system according to claim 10, wherein, the electronic switch comprises a semiconductor switch.

13. The DC power supply system according to claim 12, wherein, the semiconductor switch comprises any of the following devices: an insulated gate bipolar transistor, a field effect transistor, a thyristor, or a static transfer switch.

14. The DC power supply system according to claim 10, further comprising:
   a number 2N of energy storage devices, the output ends of the first to the 2Nth power supply circuits being electrically coupled to a corresponding one of the energy storage devices, respectively.

15. The DC power supply system according to claim 10, wherein, the output voltage of one of the power supply circuits is different from the output voltage of another one of the power supply circuit.

* * * * *